US007905471B2

(12) United States Patent
Garcia et al.

(10) Patent No.: US 7,905,471 B2
(45) Date of Patent: Mar. 15, 2011

(54) VACUUM RING DESIGNS FOR ELECTRICAL CONTACTING IMPROVEMENT

(75) Inventors: Douglas J. Garcia, Beaverton, OR (US); Jeffrey L. Fish, San Diego, CA (US); Kyung Young Kim, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1263 days.

(21) Appl. No.: 11/264,757

(22) Filed: Oct. 31, 2005

(65) Prior Publication Data

US 2006/0157082 A1 Jul. 20, 2006

Related U.S. Application Data

(60) Provisional application No. 60/630,253, filed on Nov. 22, 2004.

(51) Int. Cl.
*B25B 11/00* (2006.01)
(52) U.S. Cl. ........... 269/21; 269/289 R; 134/21; 209/573
(58) Field of Classification Search ............... 269/21, 269/20, 289 R; 209/573, 936, 572, 910, 209/920; 134/21
See application file for complete search history.

(56) References Cited

U.S. PATENT DOCUMENTS

| | | | |
|---|---|---|---|
| 3,340,727 A | 9/1967 | Bracalente et al. | |
| 4,574,236 A | 3/1986 | Hechtman | |
| 5,118,299 A | 6/1992 | Burns et al. | |
| 5,172,473 A | 12/1992 | Burns et al. | |
| 5,842,579 A * | 12/1998 | Garcia et al. | 209/573 |
| 6,040,705 A | 3/2000 | Garcia et al. | |
| 6,118,289 A | 9/2000 | Kitani et al. | |
| 6,504,393 B1 | 1/2003 | Lo et al. | |
| 6,572,091 B2 * | 6/2003 | Kimble | 269/21 |
| 6,677,772 B1 | 1/2004 | Faull | |
| 6,714,028 B2 | 3/2004 | Garcia et al. | |
| 6,817,933 B2 * | 11/2004 | Blick | 451/388 |
| 2003/0197500 A1 | 10/2003 | Saulnier et al. | |
| 2004/0217764 A1 | 11/2004 | Sasaoka | |
| 2004/0239356 A1 * | 12/2004 | Kazama | 324/761 |
| 2006/0028224 A1 | 2/2006 | Garcia | 324/756 |
| 2006/0157082 A1 * | 7/2006 | Garcia et al. | 134/21 |
| 2008/0181751 A1 * | 7/2008 | McKeever et al. | 414/222.01 |
| 2009/0127169 A1 * | 5/2009 | Boe | 209/573 |

FOREIGN PATENT DOCUMENTS

| | | |
|---|---|---|
| EP | 0 418 454 A2 | 3/1991 |
| GB | 2434212 | 10/2008 |
| TW | 301017 | 3/1997 |
| TW | 581253 | 3/2004 |

(Continued)

OTHER PUBLICATIONS

International Search Report and Written Opinion concerning related International Application No. PCT/US05/039751.

(Continued)

*Primary Examiner* — Lee D Wilson
(74) *Attorney, Agent, or Firm* — Stoel Rives LLP

(57) ABSTRACT

Recesses (72), surface contours, contact tip modifications (52, 56), and/or other methods of ensuring pressure between a bottom surface (50) of a test plate (5) and top surfaces (52) of electrical contacts (18) are employed to enhance cleaning of the top surfaces (52) of the electrical contacts (18) to promote reliable measurements of DUTs (14).

33 Claims, 11 Drawing Sheets

FOREIGN PATENT DOCUMENTS

WO    WO 03/005043 A1    1/2003

OTHER PUBLICATIONS

Taiwanese Search Report of Patent Application No. 94138948, dated Nov. 18, 2008, 1 page.
British Examination Report of Patent Application No. GB0709501, dated Apr. 29, 2008, 4 pages.
British Examination Report on Patent Application No. GB0709501, dated Aug. 1, 2008, 4 pages.
Chinese Office action of Chinese Pat. Appl. No. 20058004300.8, dated Mar. 13, 2008.
International Preliminary Report concerning related International Application No. PCT/US05/039751 (May 31, 2007).
Second Chinese Office action of Chinese Pat. Appl. No. 20058004300.8, dated Nov. 20, 2009.
Product Information: Model 3340 Enhanced Productivity MLCC Multi-Function Tester, Electro Scientific Industries, Inc. 2003.
Oct. 30, 2007 Office action in connection with U.S. Appl. No. 10/916,063.
Jun. 29, 2007 Office action in connection with U.S. Appl. No. 10/916,063.
May 29, 2007 Office action in connection with U.S. Appl. No. 10/916,063.
Sep. 26, 2006 Office action in connection with U.S. Appl. No. 10/916,063.
Apr. 4, 2006 Office action in connection with U.S. Appl. No. 10/916,063.
Third Chinese Office action of Chinse Pat. Appl. No. 20058004300.8, dated Jun. 24, 2010.

* cited by examiner

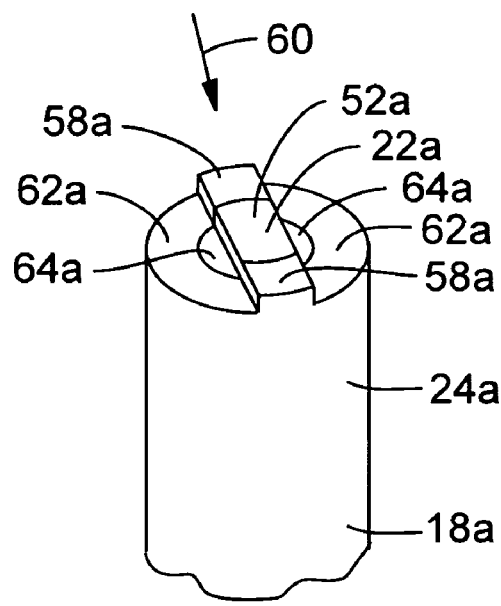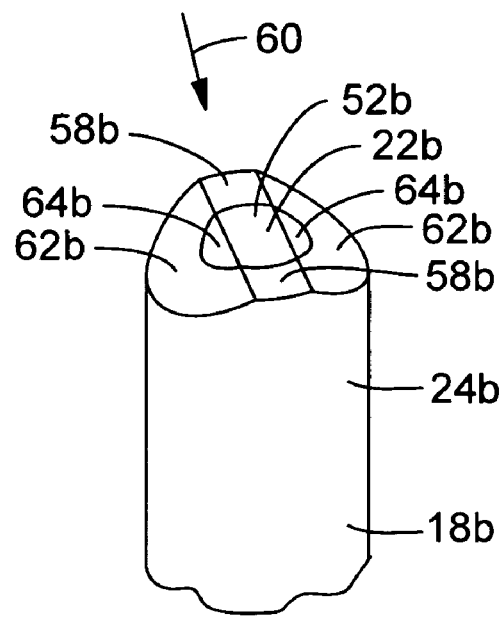
FIG. 6A  FIG. 6B
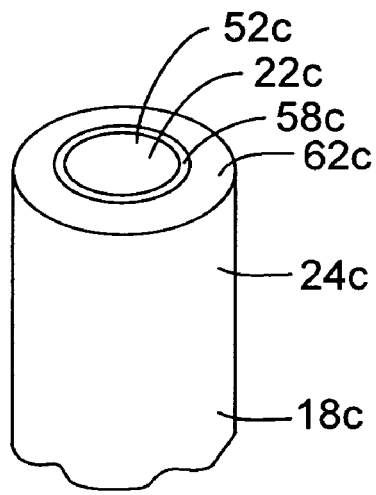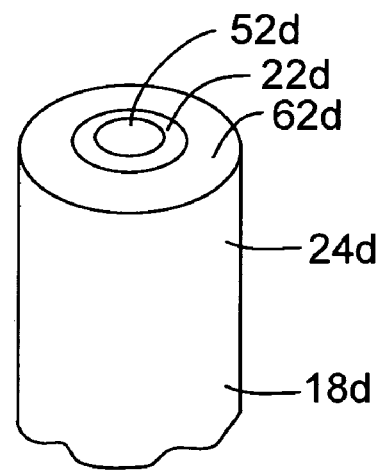
FIG. 6C  FIG. 6D

VACUUM RING DESIGNS FOR ELECTRICAL CONTACTING IMPROVEMENT

RELATED APPLICATIONS

This patent application claims benefit of U.S. Provisional Application No. 60/630,253, filed Nov. 22, 2004.

COPYRIGHT NOTICE

© 2005 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71(d).

TECHNICAL FIELD

The invention relates to electrical component handlers that test miniature electrical circuit components and, in particular, to vacuum ring design improvements for use in an electrical component handler.

BACKGROUND OF THE INVENTION

Electrical component handlers receive electrical circuit components, e.g., ceramic capacitors, present the electrical circuit components to an electronic tester for testing, and sort the electrical circuit components according to the results of the testing. An exemplary electrical component handler is described in U.S. Pat. No. 5,842,579 to Garcia et al. (the '579 patent), which is assigned to Electro Scientific Industries, Inc., the assignee of the present patent application. Design and operational advantages of the electrical component handler of the '579 patent include 1) the elimination of manual seating of components for test purposes and manual sorting; 2) the ability to handle a greater quantity of components per unit time than prior art electrical component handlers are able to handle; 3) the ability to take a randomly oriented heap of components and properly orient them; 4) the ability to present the components to a tester in multiples; and 5) the ability to sort the tested parts into a plurality of receiving or sorting bins.

FIG. 1 is a pictorial drawing of an electrical component handler 2 as described in the '579 patent. In the electrical component handler 2, one or more concentric rings 3 of component seats 4 formed in an annular test plate 5 are rotated in a clockwise direction around a turntable hub 6. As the test plate 5 turns, the component seats 4 pass beneath a loading area 10, a contact head 11 of five contact modules 12 (two shown in FIG. 1), and an ejection manifold 13. In the loading area 10, electrical circuit components or devices-under-test (DUTs) 14 (FIG. 3) are poured into the concentric rings 3, causing unseated DUTs 14 to tumble randomly until they are seated in the test plate seats 4. The DUTs 14 are then rotated beneath the contact head 11, and each DUT 14 is electrically contacted and parametrically tested. Once the DUTs 14 have been tested, the ejection manifold 13 ejects the DUTs 14 from their seats by blasts of air from selectively actuated, spatially aligned pneumatic valves. Ejected DUTs 14 are preferably directed through ejection tubes 15a into sorting bins 15b.

FIGS. 2 and 3 show the prior art contact head 11 of the '579 patent in greater detail. Specifically, FIG. 2 shows a pictorial drawing of the contact head 11 with less than a full complement of the contact modules 12 mounted thereon; and FIG. 3 is a fragmentary sectional view taken along lines 3-3 of FIG. 2 juxtaposed with a fragmentary cross-sectional view of a DUT 14 seated in the test plate 5. With reference to FIGS. 2 and 3, contact module 12 includes a plurality of upper contacts 16 and lower contacts 18 (one each shown in FIG. 3) for coupling the DUT 14 to the test plate 5. The upper contacts 16 are resilient flat metal cantilevered leaves with inclined elongated tips that project away at a shallow angle from the test plate 5. The upper contacts 16 flex slightly when they encounter the seated DUTs 14 to provide a downward contact force that is largely dictated by the thicknesses and/or end widths of the leaves. The elongated tips prevent the seated DUTs 14 from popping out of their seats (as a consequence of a "tiddlywink" effect) as the leaves pass over the back edges of the DUTs 14 as the test plate 5 advances forward. The tips of the upper contacts 16 may be coated with a metal alloy to minimize contact resistance.

The lower contacts 18 are typically stationary contacts in the form of cylinders. As shown in FIG. 4, an exemplary prior art lower contact 18 is an elongated cylinder having upper and lower planar surfaces, a central conductive core 22, and an electrically insulating outer sleeve 24. The lower contact 18 extends through holes 30 formed in a vacuum plate 32 and set between adjacent vacuum channels 34 such that the lower contact 18 is in alignment with its corresponding upper contact 16 and its corresponding component seat ring 3. The vacuum channels 34 may be aligned with vacuum ports 13 (FIG. 5) in the test plate 5 that are connected to each component seat 4 by a vacuum network (not shown) in the test plate 5. The vacuum pressure may be used to help hold the electrical components 14 within the component seats 4.

A base member 36 positioned below the vacuum plate 32 includes an upwardly projecting wall 38 formed of contiguous cylindrical scallop segments 40 that receive a row of the cylinders of the lower contacts 18. A releasable clamping mechanism 42 pushes and thereby pins the outer sleeves 24 of the lower contacts 18 against their associated scallop segments 40 of the wall 38 to maintain their orientation normal to the test plate 5. Thus, for each row of the lower contacts 18, there is a clamping mechanism and a pinning wall. A corresponding plurality of spring-biased pin contacts 44 (e.g., "pogo" pins) extends through a plurality of slots (not shown) in the bottom of the base member 36 to make electrical contact with the central cores 22 of the lower contacts 18. There is one base slot for each row of the lower contacts 18. The pin contacts 44 are preferably mounted lengthwise by their spring-biased ends in holders 46, four for each holder 46 to match a row of the lower contacts 18. Each holder 46 is affixed in a different base slot. The pin contacts 44 are coupled to the tester electronics through wires 48.

The contact head 11 includes five contact modules 12. This embodiment includes 20 upper contacts 16, five for each ring 3 of component seats 4. Each of 20 lower contacts 18 is positioned on the opposite side of the test plate 5 and in alignment with a different one of the 20 upper contacts 16, as indicated in FIG. 3 for one pair of the upper and lower contacts 16 and 18. Thus, the contact head 11 includes a full complement of contact modules 12 in which the terminals of 20 DUTs 14 can be contacted simultaneously, thereby simultaneously coupling all 20 of them to the test plate 5.

The upper and lower contacts 16 and 18 of the contact modules 12 become contaminated during operation of the electrical component handler 2. Exemplary contamination sources include friction polymerization; external debris, such as material deposits from previously tested devices; and naturally occurring oxide formation on the contact surface. Additionally, some amount of debris, such as broken devices, plating media, or fragments of refractory carriers, is typically present in or on the DUTs 14. This debris is often introduced into the test system and subsequently placed in contact with the lower contacts 18. Contamination of the upper and lower contacts 16 and 18 creates contact resistance variation that is additive to the actual resistance measurement for each DUT 14. This contamination of upper and lower contacts 16 and 18 results in rejection of acceptable DUTs 14, resulting in yield loss and a reduction in the mean time between assists (MTBA) associated with the electrical component handler 2. When such conventional handling and testing methods are used, up to 10% of the DUTs 14 are falsely rejected. These falsely rejected components are then either re-tested or thrown away as scrap. Both instances cause extra processing time and cost.

FIG. 5A is a simplified fragmentary cross-sectional view of a test plate 5 and vacuum plate 32 taken along a radial line extending medially through a row of component seats, and FIG. 5B is a simplified fragmentary cross-sectional view of a test plate and vacuum plate taken along a radial line extending medially through a row of component seats and the lower contacts. With reference to FIGS. 3-5, a bottom surface 50 of the test plate 5 is currently employed to wipe the top end 52 of the cores 22 of the lower contacts 18 clean. Unfortunately, the top ends 52 of the lower contacts 18 become contaminated eventually, despite the cleaning action of the test plate 5.

Consequently, periodic cleaning of the upper and lower contacts 16 and 18 may be required to facilitate accurate DUT measurement. The most common prior art method of cleaning the upper and lower contacts 16 and 18 entails stopping operation of the electrical component handler 2 and mechanically cleaning the upper and lower contacts 16 and 18. However, stopping the electrical component handler 2 results in lost productivity and reduces machine throughput by lowering the MTBA.

Another prior art method of removing contamination and debris entails the use of jam sensors or jam-clearing mechanisms. Implementing these additional devices increases the manufacturing and repair costs, as well as the mechanical complexity, of the electrical component handler 2.

Thus a need exists for an effective and efficient a way to carry out cleaning the contacts 18 of an electrical component handler 2.

SUMMARY

An embodiment of the present invention, therefore, facilitates maintenance of clean contact surfaces to enhance testing accuracy.

Another embodiment employs an effective and expedient manner of cleaning a contact of an electrical component handler during its operation and thereby may reduce yield loss and may increase the MTBA associated with the electrical component handler.

In an exemplary electrical component handler, the test plate can be made of a conventional test plate material, such as FR4, that is generally sufficiently flexible to flex slightly in response to pressure. The vacuum plate can be made of a conventional vacuum plate material, such as steel. Conventionally, these materials are not typically perfectly flat such that small contours may occasionally prevent the surfaces from mating well in the vicinity of the contacts and thereby inhibit cleaning of the top ends of the lower contacts by the test plate material. One or both of these materials can be, but need not be, polished to enhance the cleaning function.

In one embodiment, the top surface of the vacuum plate in the vicinity of the lower contacts is provided with recesses connected to the vacuum channels to promote improved contact between the top ends of the lower contacts and the test plate material to facilitate contact surface cleaning. By recessing areas of the vacuum plate, the bottom of the test plate is free to conform to the plane or profile of the top end of the lower contacts. This improved conformity allows the test plate to better clean the contacts, resulting in more accurate electrical measurement.

Alternatively or additionally, the bottom of the test plate may be recessed or contoured to improve the physical contact pressure between the test plate and the top ends of the lower contacts.

Alternatively or additionally, the sheaths surrounding the contacts may be recessed or contoured to improve the physical contact pressure between the test plate and the top ends of the lower contacts.

Alternatively or additionally, the tops or tips of the lower contacts may be contoured or reduced in size or made with a softer material, such as coin silver, which tends to stay cleaner more easily.

Alternatively or additionally, pressure may be applied to the top of the test plate, such as through the use of rollers, to enhance contact pressure between the test plate and the top ends of the lower contacts.

Additional aspects and advantages will be apparent from the following detailed description of preferred embodiments, which proceeds with reference to the accompanying drawings.

BRIEF DESCRIPTION OF THE DRAWINGS

FIGS. 6A, 6B, 6C, and 6D are orthographic projections showing alternative configurations for the top surfaces and outer sleeves of the lower contacts.

DETAILED DESCRIPTION OF PREFERRED EMBODIMENTS

Figure 1:
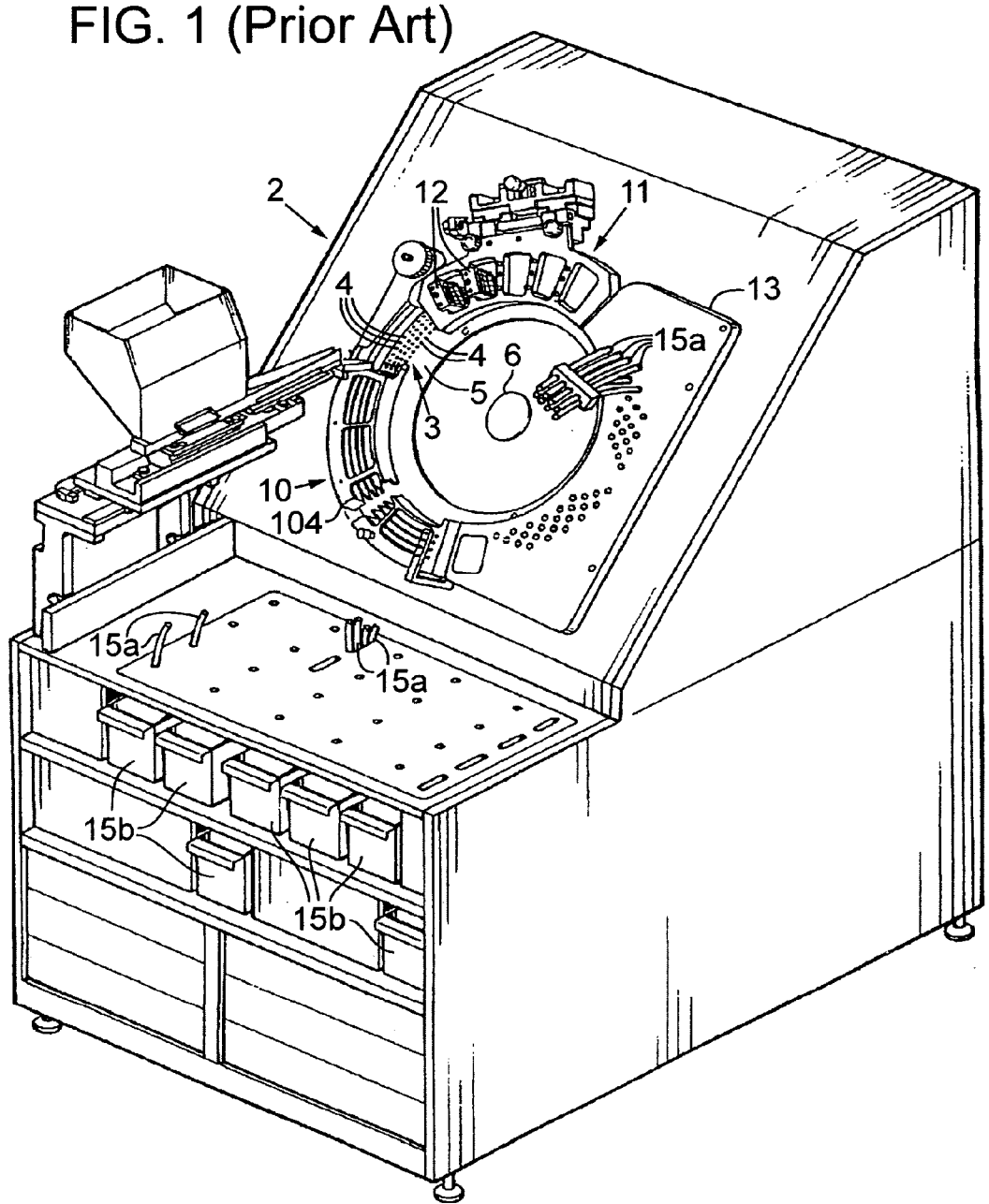
FIG. 1 is a pictorial view of an exemplary prior art electrical component handler.
Figure 2:
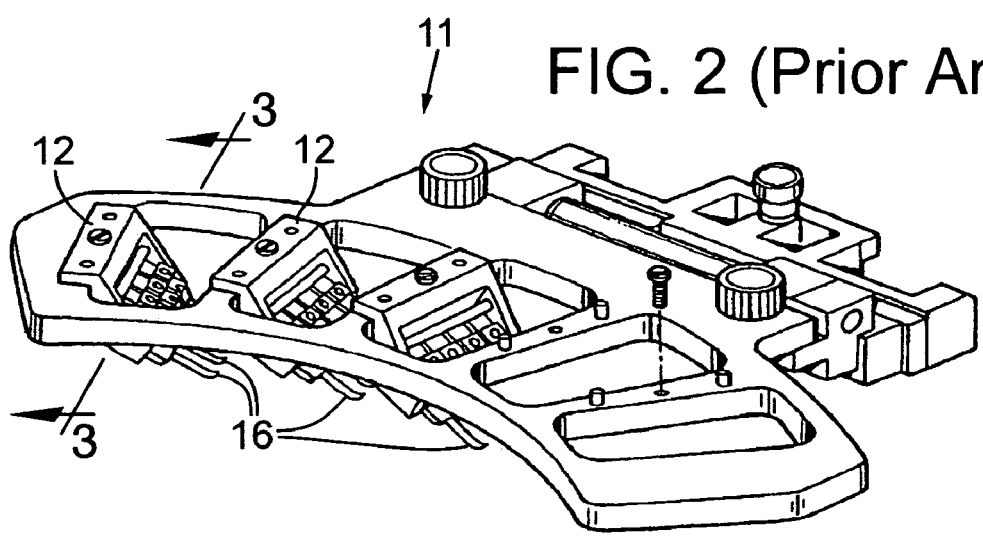
FIG. 2 is a pictorial view of a prior art contact head assembly to which are mounted less than a full complement of contact modules.

A DUT 14 may comprise any electrical circuit component, such as a capacitor, inductor, or resistor. There are many parameters that can be characterize these DUTs 14. When DUT 14 is a capacitor, for example, there are many parameters that can be used characterize it in addition to capacitance C. Some other capacitor parameters that usefully specify a capacitor's behavior in an alternating current (AC) circuit include loss angle, phase angle, power factor, and dissipation factor, all of which are measures of the loss in a capacitor when an AC signal is applied to its electrodes. They are related mathematically as follows:

$$PF=\cos(\phi)=\sin(\delta)$$

$$DF=\tan(\delta)$$

$$\phi+\delta=\pi/2$$

where PF is the power factor, DF is the dissipation factor, $\phi$ is the phase angle, and $\delta$ is the loss angle in phasor notation. Dissipation factor can also be expressed in terms of effective series resistance (ESR) at a given AC frequency as follows:

$$DF=ESR/X_C$$

where $X_C$ is the reactance of the capacitor at the given frequency.

Capacitor manufacturers typically specify their capacitors in terms of parameters such as capacitance C and dissipation factor. Manufacturers typically test their capacitors to ensure that they fall within acceptable limits before they are released for sale. If a capacitor, for example, has an excessively large dissipation factor it is rejected.

Dissipation factor can, however, be one of the more difficult electrical measurements performed by the contact modules 12 of the electrical component handler 2. As previously mentioned, contamination of the upper and lower contacts 16 and 18 creates contact resistance variation that is additive to the actual resistance measurement for each DUT 14. The dissipation factor measurement can be particularly sensitive to contact resistance variation and may be largely responsible for whether a DUT 14 is rejected or accepted. The dissipation factor is discussed in greater detail in U.S. Provisional Application No. 60/630,261 of Douglas J. Garcia, entitled Method for Repetitive Testing of an Electrical Component, filed on Nov. 22, 2004, is herein incorporated by reference.

According to another embodiment, a machine for testing electrical components comprises a testing instrument, a N ($\geq 2$) concentric rings of component seats, first and second sets of N opposing electrical contacts, and decision logic. The testing instrument has two input connections and measures a parameter of a component connected between its input connections. The component seats provide an electrical contact from one terminal of the component to a first of the two input connections of the testing instrument. The first set of N opposing electrical contacts is arranged in a first radial line through the concentric rings. The first set of opposing electrical contacts is electrically connected to the second of the two input connections of the testing instrument. The second set of N opposing electrical contacts is arranged in a second radial line through the concentric rings. The second set of opposing electrical contacts is electrically connected to the second of the two input connections of the testing instrument. The second radial line is offset from the first radial line by some angle. The concentric rings are rotatably movable relative to the first set of N opposing electrical contacts and the second set of N opposing electrical contacts. The machine measures the parameter of the components in the component seats arranged in a given radial line when the first set of N opposing electrical contacts overlay the components in the seats underlying the given radial line, thereby generating a first set of N measured parameter values. The machine measures the parameter of the components in a given radial line when the second set of N opposing electrical contacts overlay the components in the seats underlying the given radial line, thereby generating a second set of N measured parameter values. The decision logic, which is connected to the testing instrument, makes a pass/reject decision for each component in the given radial line, wherein a particular component receives a reject decision if all of the measured parameter values corresponding to the particular component are unacceptable.

Figure 3:
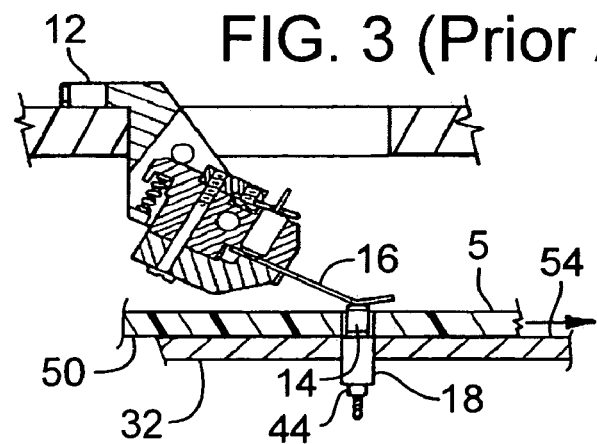
FIG. 3 is a fragmentary sectional view taken along lines 3-3 of FIG. 2 juxtaposed with a fragmentary cross-sectional view of a DUT seated in a test plate.
Figure 4:
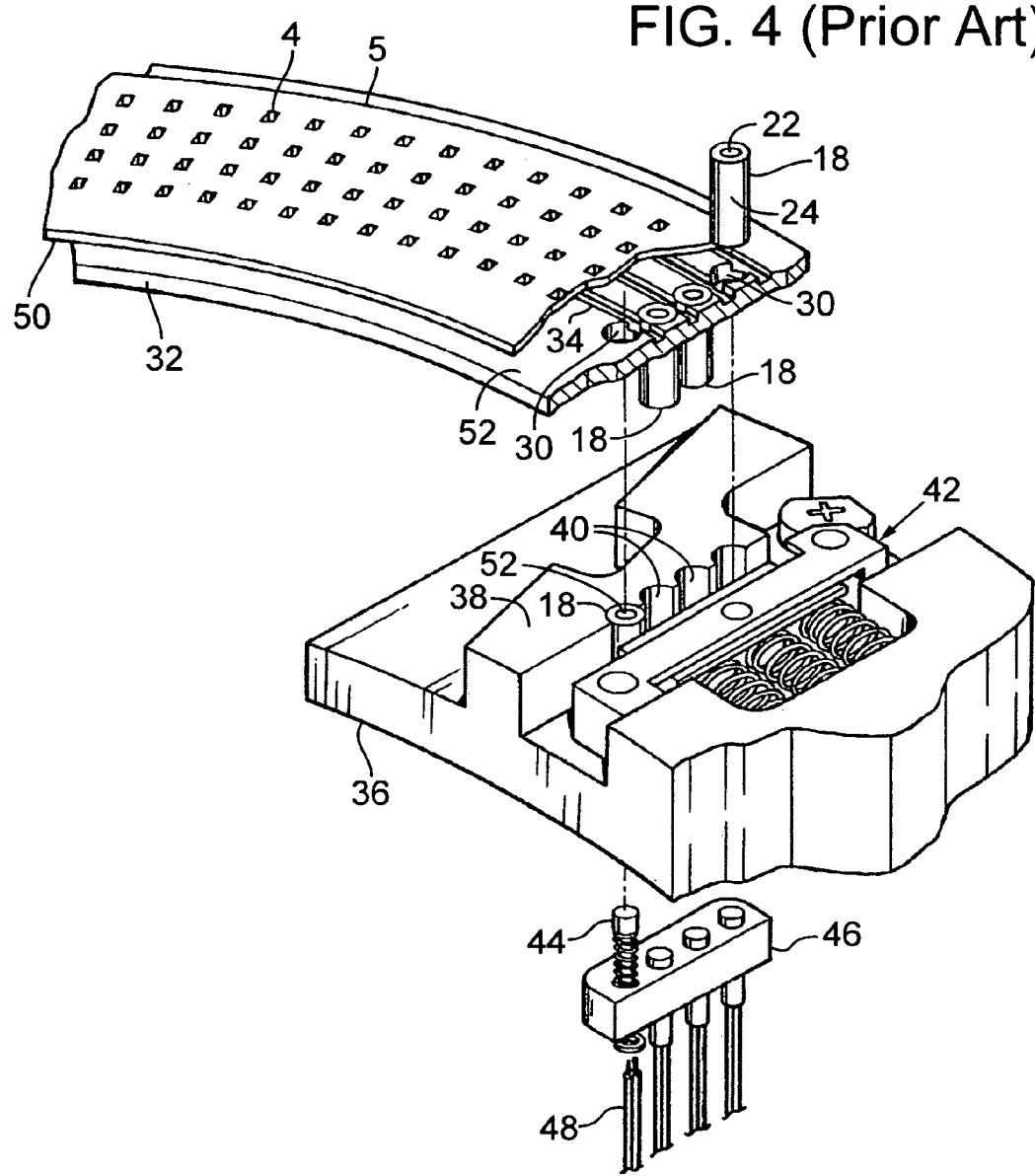
FIG. 4 is a pictorial view of the test plate of the prior art electrical component handler of FIG. 1.
Figure 5A:
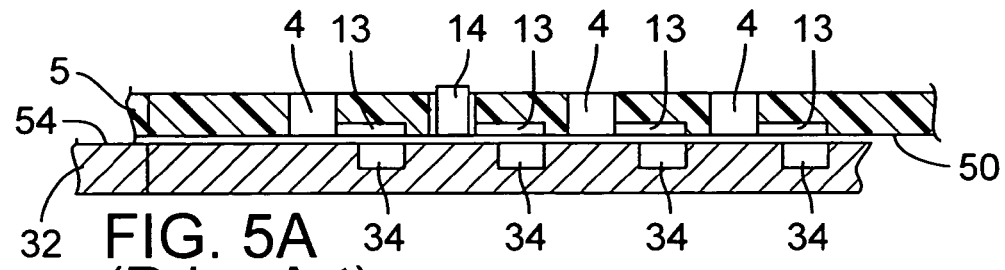
FIG. 5A is a simplified fragmentary cross-sectional view of a test plate and vacuum plate taken along a radial line extending medially through a row of component seats.
Figure 5B:
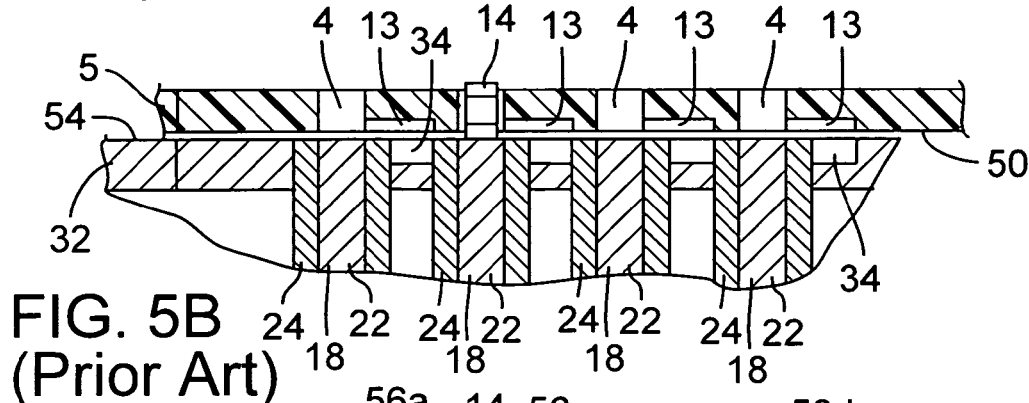
FIG. 5B is a simplified fragmentary cross-sectional view of a test plate and vacuum plate taken along a radial line extending medially through a row of component seats and the lower contacts.

On the typical electrical component handler 2, such as is described in U.S. Pat. No. 5,842,579 to Garcia et al., which is herein incorporated by reference, and/or is exemplified by conventional multi-function testers such as a Model 3300 manufactured by Electro Scientific Industries, Inc. of Portland Oreg., there are typically three "planes" that meet together: 1) the plane of the bottom surface 50 of the test plate 5; 2) the plane of a top surface 54 (FIG. 3) of the vacuum ring 32; and 3) the plane established by the top surfaces 52 of the lower contacts 18.

In view of the respective geometrical positioning of these elements, applicants have determined that it is desirable to provide good physical contact between the bottom surface 50 of the test plate 5 and the top surfaces 52 of the lower contacts 18 to rub them clean.

Figure 7:
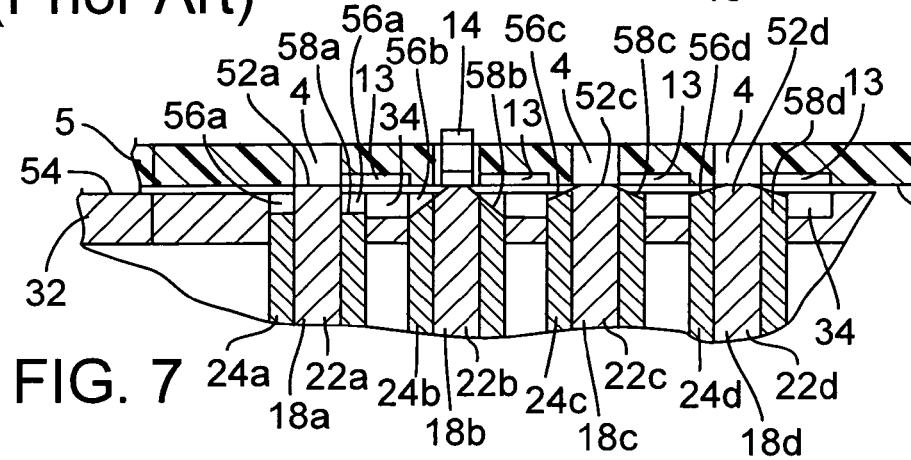
FIG. 7 is a fragmentary sectional view of a test plate and vacuum plate including alternative lower contacts.

FIGS. 6A, 6B, 6C, and 6D show four exemplary alternative embodiments of the top surfaces 52a, 52b, 52c, 52d (generically top surface 52) and the insulating outer sleeves 24a, 24b, 24c, 24d (generically outer sleeve 24) of the lower contacts 18a, 18b, 18c, 18d (generically lower contact 18), and FIG. 7 is a fragmentary sectional view of a test plate 5 and a vacuum plate 32 showing the respective recesses 56a, 56b, 56c, 56d (generically recess 56) that these lower contacts 18 form when in contact with the bottom 50 of the test plate 5. FIGS. 6A and 6B also show a preferred orientation of the lowers contacts 18a and 18b with respect to a direction of travel 60 of the test plate 5 and the electrical components 14 across the top surfaces 52 of these lower contacts 18.

With reference to FIGS. 6 and 7, the insulating outer sleeve 24 of the lower contact 18 can be recessed with respect to the height of at least a portion the central cores 22a, 22b, 22c, 22d (generically central core 22), such that the height of the insulating outer sleeve 24 is less than the height of at least a portion of the central core 22. The outer sleeve 24a of lower contact 18a has a top surface 58a with one or more recessed surfaces 62a that are generally perpendicular to the height of the central core 22a. The recessed surfaces 62a may also be generally parallel to the top surface 52a of the central core 22a. Similarly, portions of the top surface 52a of the lower contact 18a may include optional recessed surfaces 64a that may also be generally perpendicular to the height of the central core 22a and parallel to the top surface 52a. In some embodiments, recessed surfaces 64a are at the same height as recessed surfaces 62a, but recessed surfaces 64a may also be taller or shorter than recessed surfaces 62a. Skilled persons will appreciate however, that the top surface 52a of the central core 22a need not have a recessed portion.

In some embodiments, the nonrecessed portions of the top surface 58a and the top surface 52a have a width, which is perpendicular to the direction of travel, that is greater than the width of the bottom surfaces of the components 14. Alternatively, the widths of these nonrecessed portions may be the same size as the diameter of the central core 22a or they may be smaller than the width of the bottom surfaces of the components 14. An exemplary typical central core 22 has a diameter that is less than or equal to about 2.54 mm, but a central core 22 may also have diameter or major axis that is greater than 2.54 mm. Skilled persons will appreciate that central core 22 and outer sleeve 24 may have a cross-sectional profiles that are noncircular, such as square.

In some embodiments, the height differential between the top surface 52a of the central core 22 and the recessed surface 62a of the outer sleeve 24 can be very small, especially when combined with vacuum plate recesses as later described. In some embodiments, the height differential is greater than 12 or 14 microns.

In view of the foregoing and with particular reference to FIG. 6B, the outer sleeve 24b of lower contact 18b has a recessed surface 62b that is generally beveled or tapered with respect to the top surface 58b. An exemplary bevel angle is 45 degrees, but the angle may be more acute or more obtuse. Skilled persons will appreciate that a tapered recessed surface 62b may alternatively have a curved shape that is concave, convex, or complex. Similarly, the central core 22c may optionally have a recessed surface 64b that is also beveled or tapered with respect to the top surface 52b. The bevel angle or curve taper of the recessed surface 64b may be the same as or different from that of the recessed surface 62b, and bevels or curves can be continuous or discontinuous. In alternative embodiments, one of the recessed surfaces 62b or 64b may be curved while the other surface is beveled. Skilled persons will appreciate that the top surface 52b may itself be curved or somewhat pointed.

In view of the foregoing and with particular reference to FIG. 6C, the recessed surface 62c of the outer sleeve 24c may be beveled from its entire perimeter for ease of manufacturing or to avoid orientation requirements with respect to the direction of travel 60. In view of the foregoing, FIG. 6D shows an alternative embodiment in which a recessed surface 64d of the central core 22d is beveled with respect to the top surface 52d, and the outer sleeve 24d has a top surface 58d that continues the bevel angle. The bevel angle or curve taper of the recessed surface 64d may be the same as or different from that of the top surface 58d, and bevels or curves can be continuous or discontinuous. In alternative embodiments, one of the recessed surfaces 58d or 64d may be curved while the other surface is beveled.

Alternatively or additionally in other embodiments, the tip or top surface 52 of the central core 22 of the lower contact 18 may be contoured or reduced in size or made with a softer material, such as coin silver, that tends to stay cleaner more easily. Skilled persons will also appreciate that the recesses 56 can be completely circumferential about the central core 22 and may provide the insulating outer sleeve 24 with a uniform height with respect to the height of the central core 22 or may provide the insulating outer sleeve 24 with a height that varies about the central core 22. Skilled persons will also appreciate that numerous combinations and variations are possible.

Figures 8A, 8B, 8C:
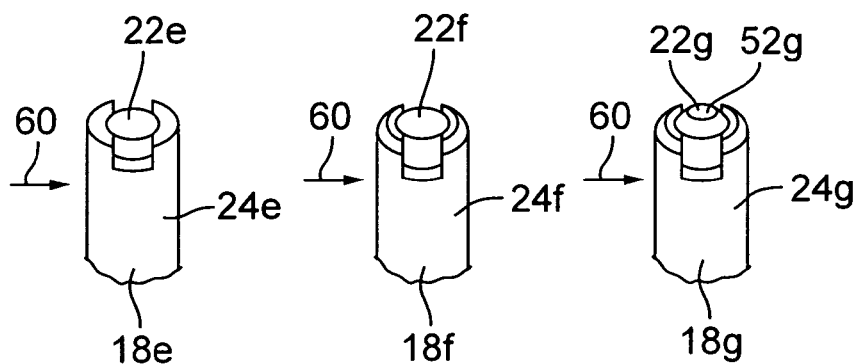
FIGS. 8A, 8B, and 8C are orthographic projections showing additional alternative lower contacts.

FIGS. 8A, 8B, and 8C, show further alternative lower contacts 18e, 18f, and 18g (generically lower contact 18) with respective insulating outer sleeves 24e, 24f, and 24g (generically outer sleeve 24) and respective central cores 22e, 22f, and 22g (generically central core 22). In these embodiments, the respective recesses 56e, 56f, and 56g (generically recess 56) recess may extend only a minor part of the way around the central core 22. For example, some embodiments may provide one or more separated recesses 56 along the front, back, or sides of the central core 22. Moreover, when a plurality of separated recesses 56 are employed, the corresponding portions of the insulating outer sleeves 24 may have the same heights, curves, or bevels or different heights, curves or bevels.

With reference to FIG. 8A, the outer sleeve 24e of lower contact 18e has a pair of recesses 56e that may have dimensions similar to those of the recess 56a except that they are effected in the form of separated notches. With reference to FIG. 8B, the outer sleeve 24f of lower contact 18f has a pair of recesses 56f that may have dimensions similar to those of the recess 56b or 56c except that they are effected in the form of separated chamfered notches. With reference to FIG. 8C, the outer sleeve 24g of lower contact 18g has a pair of recesses 56g that may have dimensions similar to those of the recess 56d except that they are effected in the form of separated chamfered notches.

These exemplary recesses 56 may have a width that is about one quarter of the circumference of the central core 22 or the outer sleeve 24, but the recess width may be smaller or larger. These recesses 56 may have the same or different widths and may have top surfaces 58 that have the same or different heights or bevel angles. The recesses 56 may be equally or unequally offset and may be oriented to be perpendicular the direction of travel 60 of the test plate 5 across the vacuum plate 32 and the top surface 52 of the central core 22. Skilled persons will appreciate that the outer sleeve 24 may have one, two, or multiple recesses 56.

Figure 9:
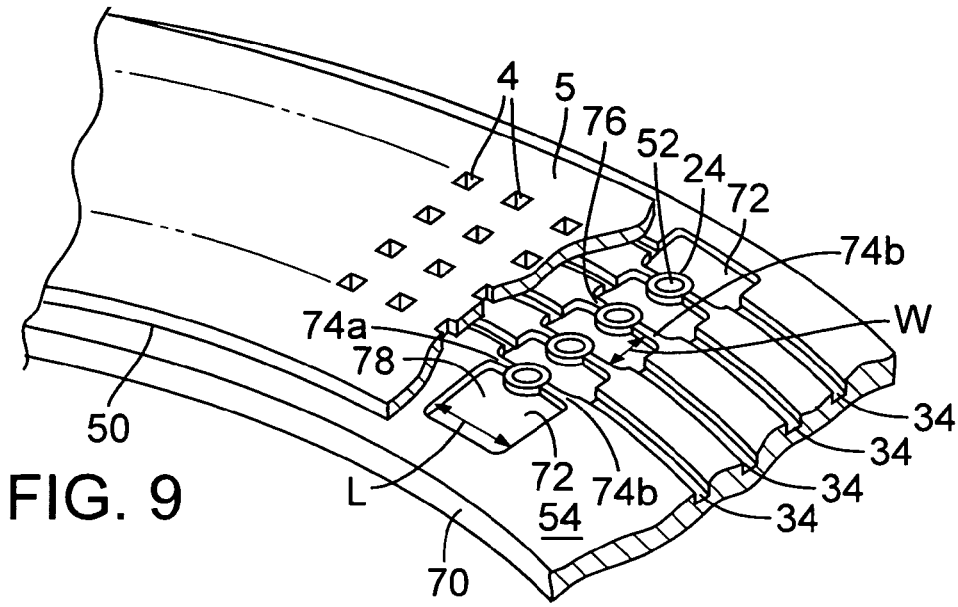
FIG. 9 is a pictorial view of a vacuum plate having vacuum-connected recesses separated by bridges.
Figure 10:
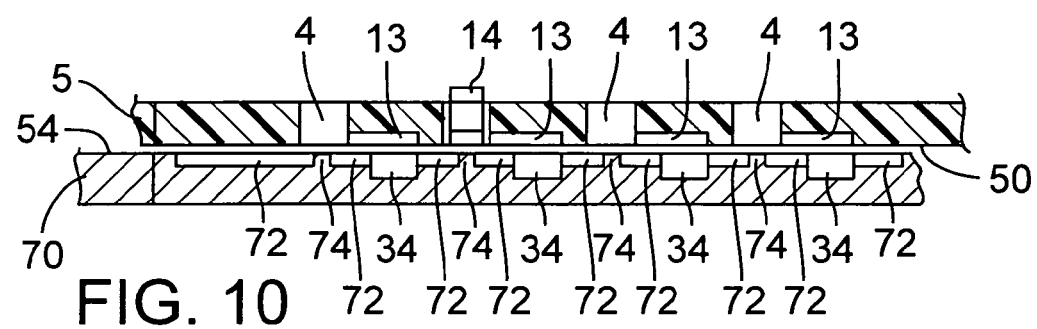
FIG. 10 is a fragmentary sectional view of a test plate and vacuum plate having the vacuum-connected recesses of FIG. 9.
Figure 11:
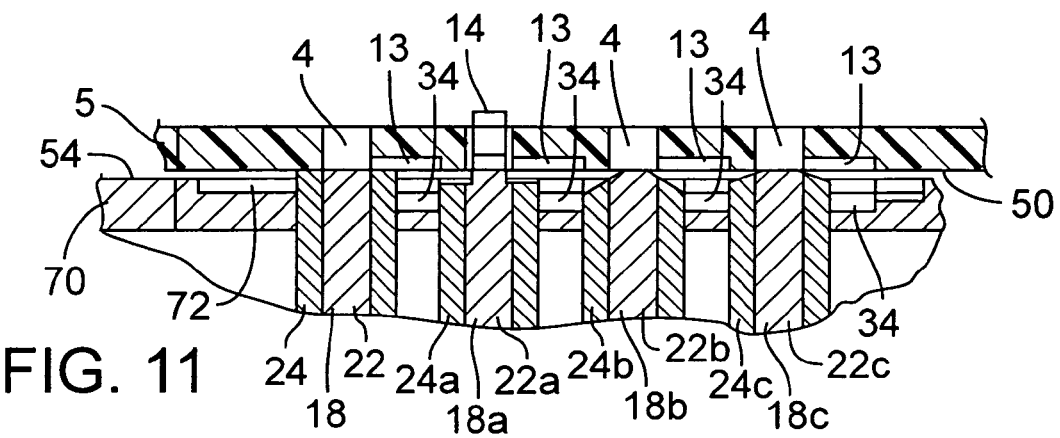
FIG. 11 is a fragmentary sectional view of a test plate and vacuum plate having the vacuum-connected recesses of FIG. 9 including the lower contacts.

FIG. 9 is an orthographic view of a vacuum plate 70 having vacuum-connected plate recesses 72 separated by front bridges 74a and back bridges 74b (generically bridges 74). FIGS. 11 and 10 are fragmentary sectional views of the vacuum plate 70 with and without the lower contacts 18. With reference to FIGS. 9-11, in some embodiments, the plate recesses 72 have dimensions sufficient to cause the test plate 5 to flex toward and/or partly into the plate recesses 72 in response to vacuum suction to insure adequate contact of the bottom surface 50 of the test plate 5 with the top surface 52 of the central core of the lower contact 18.

In some embodiments, the plate recesses 72 have an average width W that is greater than the width of the vacuum channels 34. In some embodiments, the plate recesses 72 have an average width W that is greater than about 3.8 mm. In some embodiments, the plate recesses 72 have an average width W that is greater than about 6.3 mm. In some embodiments, the plate recesses 72 have an average width W that is up to about almost the distance between the centers of adjacent central cores 22. Skilled persons will appreciate that the width of the plate recess 72 need not be uniform and that each plate recess 72 need not have the same width.

In some embodiments, the plate recesses 72 have an average length L that is greater than the diameter of the central core 22. In some embodiments, the plate recesses 72 have an average length L that is greater than the diameter of the lower contact 18 including the thickness of the outer sleeve 24. In some embodiments, the plate recesses 72 have an average length L that is greater than about 3.8 mm. In some embodiments, the plate recesses 72 have an average length L that is greater than about 6.3 mm. In some embodiments, the plate recesses 72 have an average length L that is greater than the distance between the centers of adjacent central cores 22. In some embodiments, the plate recesses 72 have an average length L that is greater than the average width W. In some embodiments, the plate recesses 72 have an average length L that is shorter than the average width W. Skilled persons will appreciate that the length of the plate recess 72 need not be uniform and that each plate recess 72 need not have the same length.

In some embodiments, the plate recesses 72 have a bottom surface 78 at an average depth that is about the same as the depth of the vacuum channels 34, but the depth of the plate recesses may be shallower or deeper. In some embodiments, the plate recesses 72 have an average depth that is greater than about 2 microns. In some embodiments, the plate recesses 72 have an average depth that is greater than about 12 microns. Skilled persons will appreciate that the depth of the plate recess 72 need not be uniform and that each plate recess 72 need not have the same depth. The depth may, for example, be sloped toward or away from the lower contact 18.

In some embodiments, the plate recesses 72 have a rectangular or square surface area. In some embodiments, the plate recesses 72 have a circular, oval, or curve bordered surface area. In some embodiments, the plate recesses 72 have a surface area that resembles other geometric shapes. Skilled persons will appreciate that the plate recesses 72 need not be symmetrical and their edges need not be perpendicular.

In some embodiments, the bridges 74 are employed to minimize or prevent the electronic component from falling into the plate recesses 72 or from becoming askew in the component seats 4 and thereby are oriented for successful electrical contact with both the upper contacts 16 and the lower contacts 18. In some embodiments, the bridges 74 are about as wide as the diameter of the central core 22, but the bridges 74 can be narrower or wider. In some embodiments, the bridges 74 are about as wide as the diameter of the lower contact 18 including the thickness of the outer sleeve 24, but the bridges 74 can be narrower or wider. In some embodiments, the bridges 74 are wider than or equal to about 1.25 mm. In some embodiments, the bridges 74 are narrower than or equal to about 2.5 mm. Skilled persons will appreciate that the width of the bridge 74 need not be uniform and that each bridge 74 need not have the same width.

In some embodiments, the bridges 74 have a length that is greater than half of the diameter of the central core 22. In some embodiments, the bridges 74 have a length that is greater than half of the diameter of the lower contact 18 including the thickness of the outer sleeve 24. In some embodiments, the bridges 74 have a length that is greater than about 1.5 mm. In some embodiments, the bridges 74 have a length that is greater than about 3 mm. In some embodiments, the bridges 74 have a length that is greater than half of the distance between the centers of adjacent central cores 22. In some embodiments, the bridges 74 have a length that is greater than their width. In some embodiments, the bridges 74 have a length that is shorter than their width Skilled persons will appreciate that the length of the bridge 74 need not be uniform and that each bridge 74 need not have the same length.

In some embodiments, the bridges 74 have a top surface 76 that is generally flush with the top surface 54 of the vacuum plate 32. In some embodiments, the bridges 74 have a top surface 76 that is generally at an elevation between the top surface 54 of the vacuum plate 32 and the bottom surfaces 78 of the plate recesses 72. The bridge elevation may be uniform, but need not be so. In some embodiments, the bridge 74 slopes downwardly from the top surface 54 of the vacuum plate 32 toward the bottom surface 78 in the vicinity of the central core 22. In some embodiments, the bridge 74 slopes upwardly from the bottom surface 78 of the plate recess 72 toward the top surface 52 of the central core 22.

In some embodiments, the bridges 74 are centered between the vacuum channels 34 and/or aligned with the central cores 22. The bridges 74 may be relatively straight or curved to accommodate the curvature of the test plate 5 and the vacuum plate 70. The bridges 74 may be equidistantly spaced.

Figure 12A:
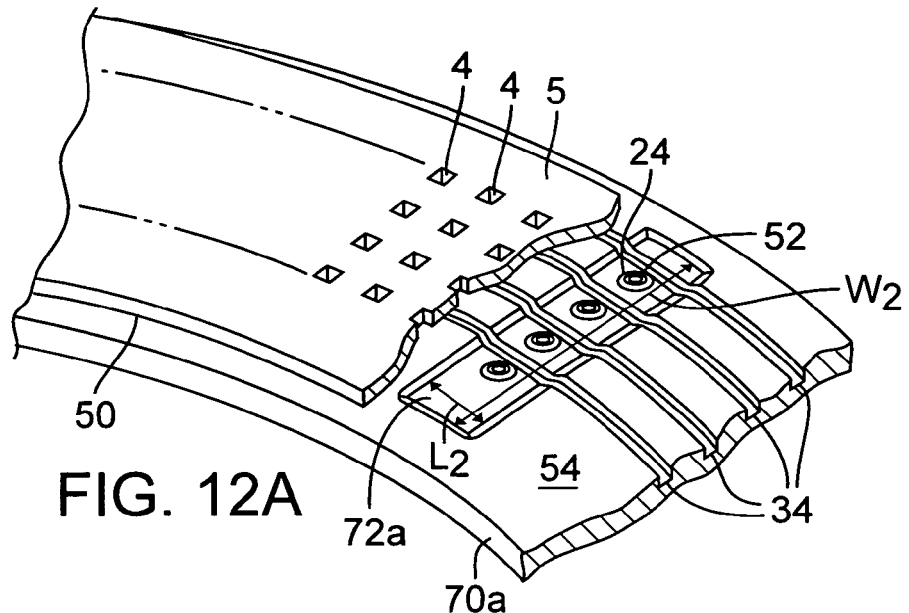
FIGS. 12A and 12B are pictorial views of a test plate and alternative vacuum plate having a common vacuum-connected recess that encompasses multiple electrical contacts.
Figure 13:
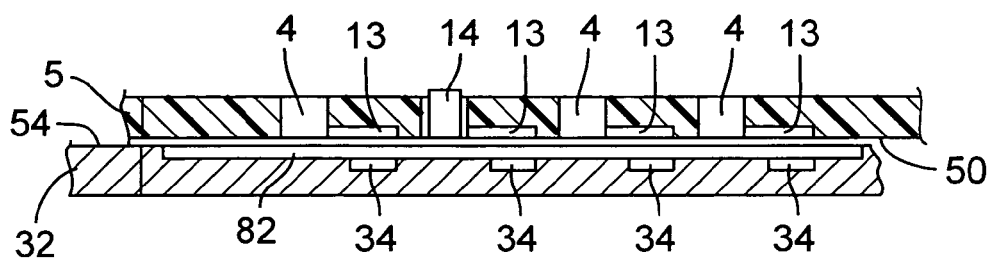
FIG. 13 is a fragmentary sectional view of a test plate and the alternative vacuum plate of FIG. 12 having a common vacuum-connected recess that is adapted to encompass multiple electrical contacts.
Figure 14:
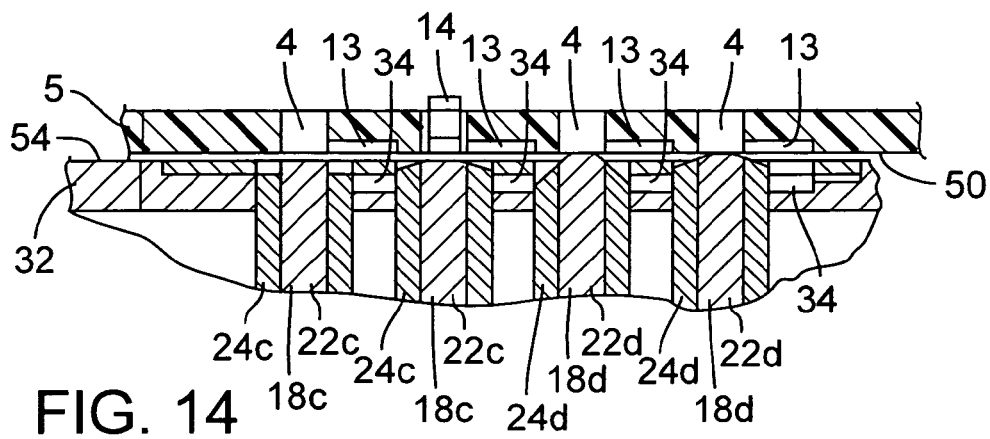
FIG. 14 is a fragmentary sectional view of a test plate and the alternative vacuum plate of FIG. 12 having a common vacuum-connected recess that encompasses multiple electrical contacts.
Figure 12B:
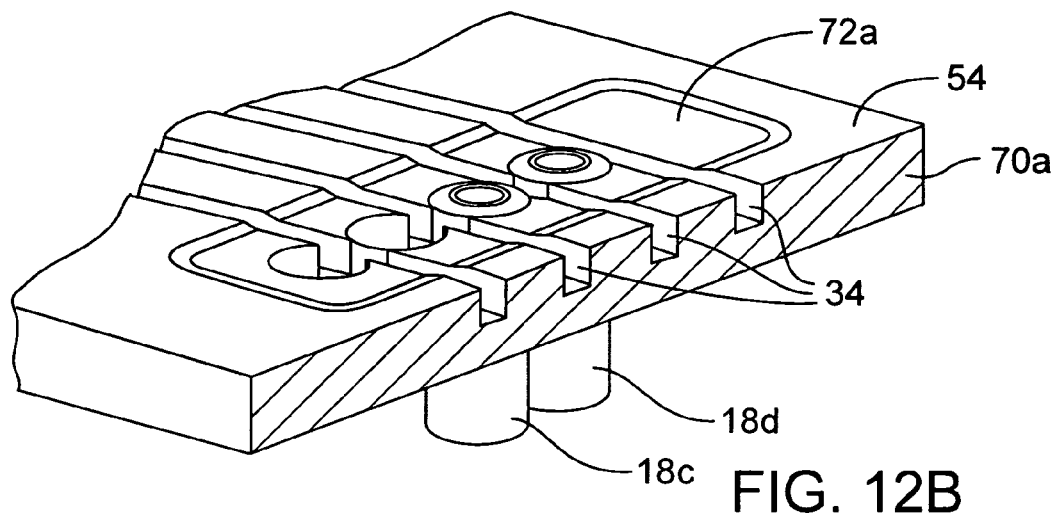
Figure 12C:
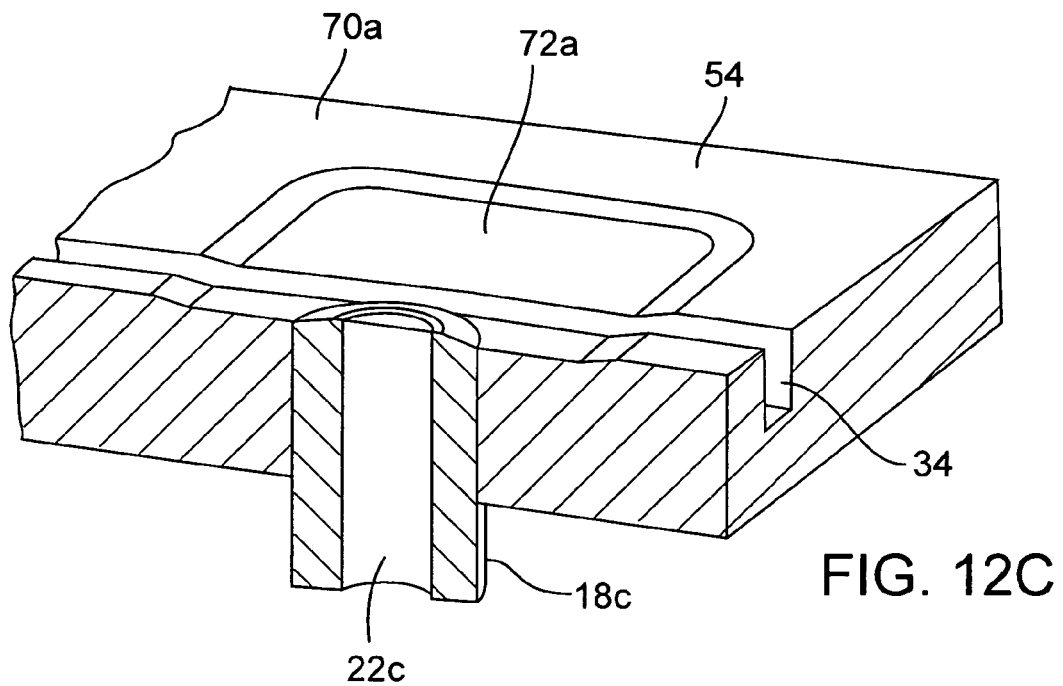
FIG. 12C is an enlarged cross-sectional view through the vacuum plate and one of the lower contacts shown in FIG. 12A.

FIGS. 12A, 12B, and 12C show different views of a alternative vacuum plate 70a having a common vacuum-connected recess 72a that encompasses multiple lower contacts 18. FIGS. 13 and 14 are fragmentary sectional views of the vacuum plate 70a without and with the lower contacts 18. With reference to FIGS. 12-14, in some embodiments, the common recess 72a has dimensions sufficient to cause the test plate 5 to flex toward and/or partly into the common recess 72 in response to vacuum suction to insure adequate contact of the bottom surface 50 of the test plate 5 with the top surface 52 of the central core of the lower contact 18.

In some embodiments, the common recess 72a has an average width $W_2$ that is greater than the width spanning all of the lower contacts 18. In some embodiments, the common recess 72a has an average width $W_2$ that is greater than about 24.1 mm. Skilled persons will appreciate that the width of the common recess 72a may be uniform or symmetrical but need not be so.

In some embodiments, the common recess 72a has an average length $L_2$ that is greater than the diameter of the central core 22. In some embodiments, the common recess 72a has an average length $L_2$ that is greater than the diameter of the lower contact 18 including the thickness of the outer sleeve 24. In some embodiments, the common recess 72a has an average length $L_2$ that is greater than about 5.1 mm. In some embodiments, the common recess 72a has an average length $L_2$ that is greater than about 6.3 mm. In some embodiments, the common recess 72a has an average length $L_2$ that is greater than the distance between the centers of adjacent central cores 22. In some embodiments, the common recess 72a has an average length $L_2$ that is greater than the average width $W_2$. In some embodiments, the common recess 72a has an average length $L_2$ that is shorter than the average width $W_2$. Skilled persons will appreciate that the length of the common recess 72a need not be uniform and that each common recess 72a need not have the same length.

In some embodiments, the common recess 72a has a bottom surface 78 at an average depth that is about the same as the depth of the vacuum channels 34, but the depth of the common recess may be shallower or deeper. In some embodiments, the common recess 72a has an average depth that is greater than about 2 microns. In some embodiments, the common recess 72a has an average depth that is greater than about 12 microns. Skilled persons will appreciate that the depth of the common recess 72 may be uniform but need not be so. The depth may, for example, be sloped toward or away from the lower contact 18.

In some embodiments, the common recess 72a has a rectangular or square surface area. In some embodiments, the common recess 72a has a circular or curve bordered surface area. In some embodiments, the common recess 72a has a surface area that resembles other geometric shapes. Skilled persons will appreciate that the common recess 72a may be symmetrical or may have perpendicular edges but need not have such characteristics.

Figure 15:
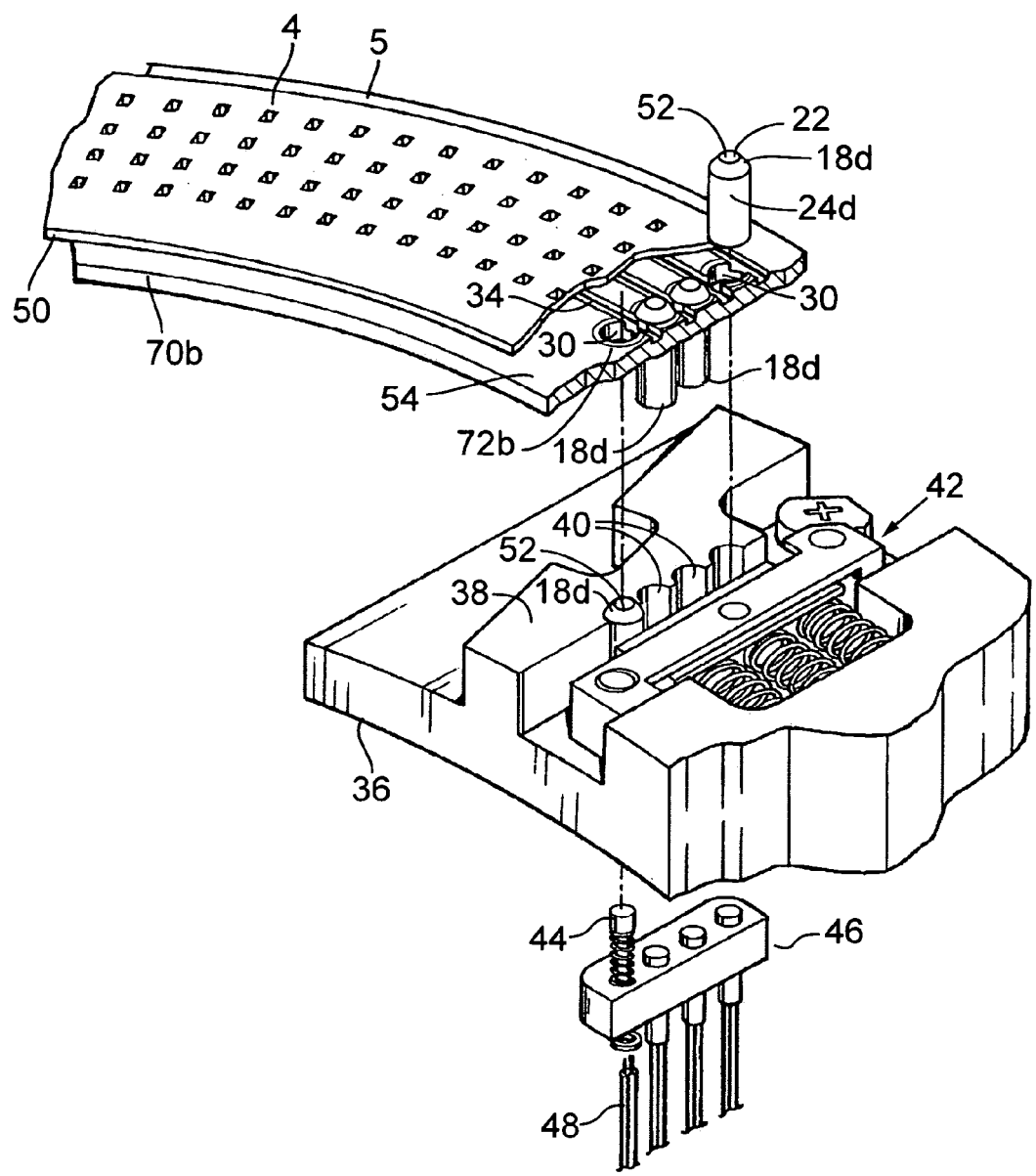
FIG. 15 is a pictorial view of a test plate and vacuum plate having alternative vacuum-connected recesses.

FIG. 15 is an orthographic view of a vacuum plate 70b having alternative vacuum-connected recesses 72b. With reference to FIG. 15, the recesses 72b are formed to concentrically surround the outer perimeter of the contact holes 30 or outer sleeves 24. The lengths of the recesses 72b may be short, particularly if the outer sleeves 24 have recesses. The recess length and/or width may combine with the thickness of the recess in the outer sleeve 24 to provide a combined width and/or length that is sufficient to flex the material of test plate 5. In one embodiment, the recesses 70b may slope downwardly toward the outer sleeves 24 to meet the recessed surfaces 62 that in turn slant upwardly toward the top surface 52 of central core 22.

Alternatively or additionally, pressure may be applied to the top of the test plate 5, such as through the use of rollers, to enhance contact pressure between the test plate 5 and the top ends of the central cores 22 of the lower contacts 18. Exemplary rollers and contact biasing mechanism are disclosed in U.S. patent application Ser. No. 10/916,063, entitled SELF-CLEANING LOWER CONTACT, which is herein incorporated by reference.

Figure 16A:
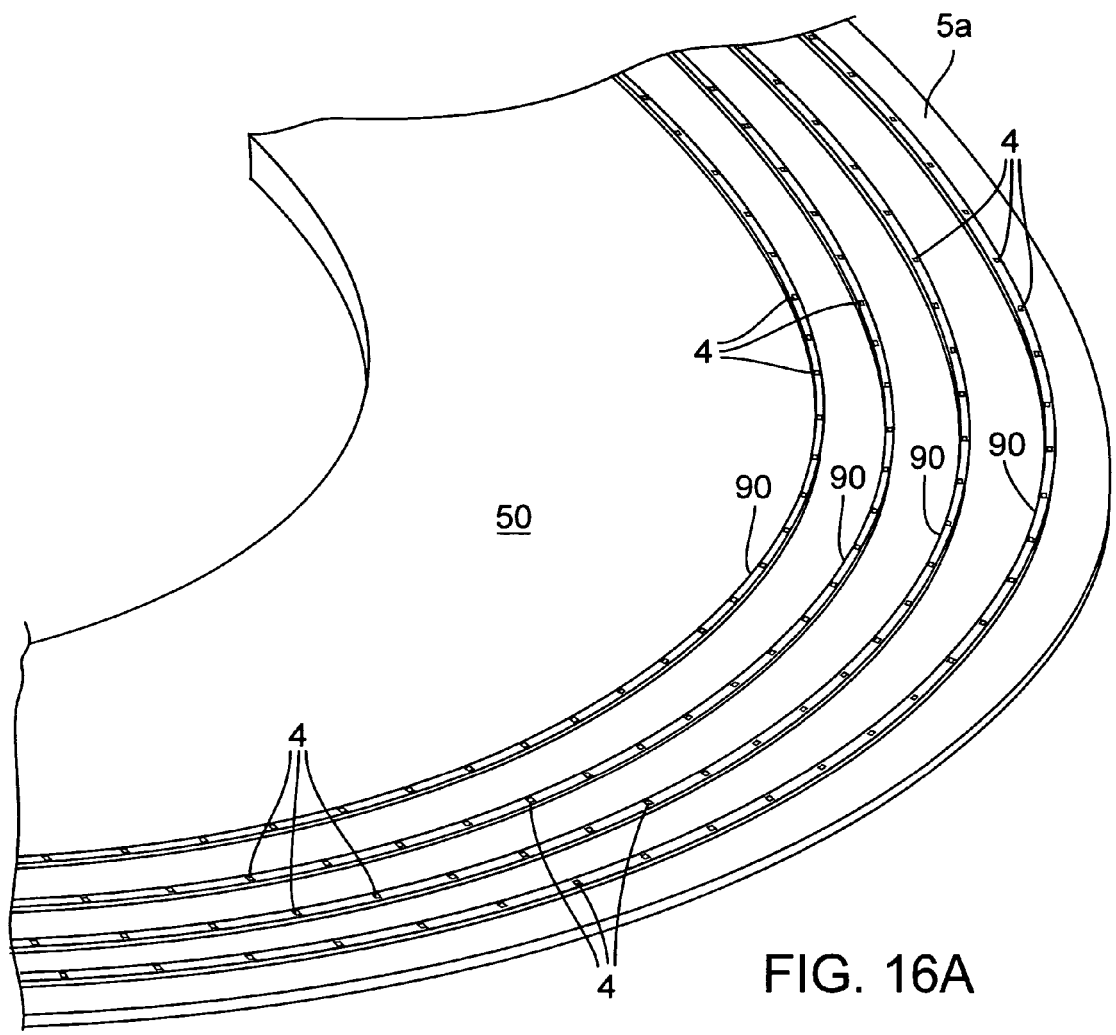
FIG. 16A is a pictorial view of the bottom surface of an alternative test plate showing denticular rails designed to come into contact with the top surfaces of the contact cores.
Figure 16B:
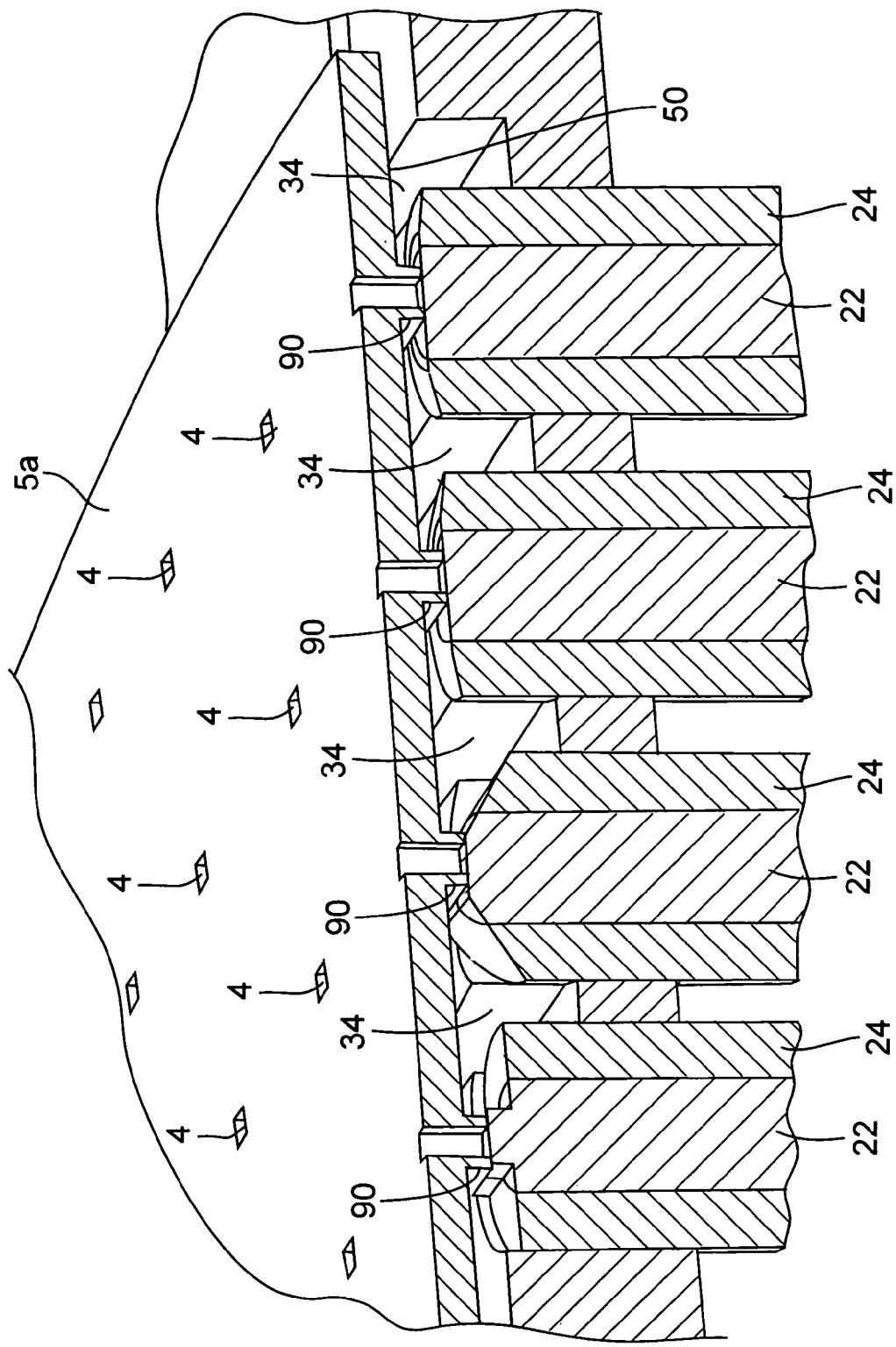
FIG. 16B is a fragmentary sectional view of the alternative test plate having the spaced-apart denticular rails that are aligned with the component seats.

FIG. 16A shows an alternative test plate 5a showing spaced-apart denticular rails 90 that are designed to come into contact with the top surfaces 52 of the contact cores 22, and FIG. 16B shows that the denticular rails 90 are aligned with the component seats 4. With reference to FIGS. 16A and 16B, in another embodiment, the test plate 5a alternatively or additionally has one or more features or contours such as denticular rails 90 in its bottom surface 50 that come in contact with the top surface 52 of the central cores 22 of electrical contacts 18 to clean them. In some embodiments, the feature may be a ridge that may be tapered in one or more directions.

It will be obvious to those having skill in the art that many changes may be made to the details of the above-described embodiments without departing from the underlying principles of the invention. The scope of the present invention should, therefore, be determined only by the following claims.

The invention claimed is:

1. An electrical component handler, comprising:
a vacuum plate having an upper surface in a plane, vacuum channels formed in the vacuum plate along spaced-apart lines, each vacuum channel having a width, and contact holes positioned between the spaced-apart lines and formed through the vacuum plate, the contact holes being adapted to receive respective electrical contacts and permit their top surfaces to be generally in the plane of the upper surface of the vacuum plate;
a test plate having a bottom surface supported by the upper surface of the vacuum plate such that the bottom surface of the test plate is adapted to slide across the upper surface of the vacuum plate, the test plate having component seats for holding electrical components, and alignment of the component seats on the test plate with respect to the contact holes being adapted to bring electrical components in the components seats into contact with the electrical contacts;
a recess in the upper surface of the vacuum plate in vicinity to a contact hole, the recess having an average width that is greater than the width of the vacuum channel; and
pressure means for creating physical contact between the bottom surface of the test plate and the top surface of the electrical contact whenever a vacuum source is connected to the vacuum channel during sliding motion between the test plate and vacuum plate such that the physical contact and the sliding motion cooperate to clean the top surface of the electrical contact.

2. The electrical component handler of claim 1 in which the recess is substantially concentric about the contact hole.

3. The electrical component handler of claim 1 in which the recess has a varying level of depth.

4. The electrical component handler of claim 1 in which a common recess encompasses more than one contact hole.

5. The electrical component handler of claim 1 in which the recess has a surface profile that is rectangular, oval, circular, or triangular.

6. The electrical component handler of claim 1 in which the recess has dimensions sufficient to cause the test plate to flex toward the recess in response to the vacuum suction.

7. The electrical component handler of claim 1 in which the plate recess has an average surface dimension that is greater than about 3.8 mm.

8. The electrical component handler of claim 1 in which the plate recess has a bottom surface at an average depth that is shallower than that of the vacuum channel.

9. The electrical component handler of claim 1 in which the plate recess has a bottom surface that has an average depth that is greater than about 2 microns.

10. The electrical component handler of claim 1 in which the pressure means is the vacuum source.

11. The electrical component handler of claim 1 in which the pressure means is a roller applied to an upper surface of the test plate.

12. The electrical component handler of claim 1 in which the recess has dimensions sufficient to cause the test plate to flex partly into the recess in response to the vacuum suction.

13. The electrical component handler of claim 1 in which the plate recess has an average surface dimension that is greater than about 6.3 mm.

14. The electrical component handler of claim 1 in which the contact holes are arranged in a row, in which each electrical contact has core with a center, and in which the plate recess has an average surface dimension that is greater than or equal to a distance between the centers of neighboring cores.

15. The electrical component handler of claim 1 further comprising multiple plate recesses having different average surface dimensions.

16. The electrical component handler of claim 1 in which the plate recess has average width and length dimensions that are different.

17. The electrical component handler of claim 1 in which the plate recess has a bottom surface that has an average depth that is greater than about 12 microns.

18. The electrical component handler of claim 1 in which the electrical component handler includes a testing device for measuring dissipation factor of the electrical components in the component seats.

19. The electrical component handler of claim 1 in which the test plate is made of a material that is sufficiently flexible to flex in response to pressure from the pressure means.

20. The electrical component handler of claim 1 in which the test plate conforms to a profile of the top surface of the electrical contact in response to pressure from the pressure means.

21. An electrical component handler, comprising:
a vacuum plate having an upper surface in a plane, vacuum channels formed in the vacuum plate along spaced-apart lines, each vacuum channel having a width, and contact holes positioned between the spaced-apart lines and formed through the vacuum plate, the contact holes being adapted to receive respective electrical contacts and permit their top surfaces to be generally in the plane of the upper surface of the vacuum plate;
a test plate having a bottom surface supported by the upper surface of the vacuum plate such that the bottom surface of the test plate is adapted to slide across the upper surface of the vacuum plate, test plate having component seats for holding electrical components, and alignment of the component seats on the test plate with respect to the contact holes being adapted to bring electrical components in the components seats into contact with the electrical contacts, the electrical contacts having a core and an insulating outer sleeve both of which have top surfaces;
a gap at the top surface of an insulating outer sleeve with respect to the top surface of the core such that the gap creates a recess with respect to the upper surface of the vacuum plate in vicinity to a contact hole;
a vacuum suction connection between the recess and a vacuum channel;
pressure means for creating physical contact between the bottom surface of the test plate and the top surface of the electrical contact whenever a vacuum source is connected to the vacuum channel during sliding motion between the test plate and vacuum plate such that the physical contact and the sliding motion cooperate to clean the top surface of the electrical contact.

22. The electrical component handler of claim 21 in which the top surface of the outer sleeve is generally parallel to the top surface of the core.

23. The electrical component handler of claim 21 in which the top surface of the outer sleeve has a height that is greater than 2 microns shorter than that of the top surface of the core.

24. The electrical component handler of claim 21 in which the top surface of the outer sleeve is generally beveled or tapered with respect to the top surface of the core.

25. The electrical component handler of claim 21 in which core has an average diameter and the top surface of the core has a dimension that is smaller than the average diameter.

26. The electrical component handler of claim 25 in which the top surface of the core is generally beveled or tapered to meet its outer side surface.

27. The electrical component handler of claim 21 has a core with a top surface that comprises a material that is softer than that of the test plate.

28. The electrical component handler of claim 21 in which the gap creates the recess between the contact hole and the core.

29. The electrical component handler of claim 21 in which the test plate conforms to a profile of the top surface of the electrical contact in response to pressure from the pressure means.

30. An electrical component handler, comprising:
a vacuum plate having an upper surface in a plane, vacuum channels formed in the vacuum plate along spaced-apart lines, each vacuum channel having a width, and contact holes positioned between the spaced-apart lines and formed through the vacuum plate, the contact holes being adapted to receive respective electrical contacts and permit their top surfaces to be generally in the plane of the upper surface of the vacuum plate;
a test plate having component seats for holding electrical components, the test plate having a bottom surface that is adapted to slide across the upper surface of the vacuum plate, and alignment of the component seats on the test plate with respect to the contact holes being adapted to bring electrical components in the components seats into contact with the electrical contacts,
a contour in the bottom surface of the test plate adapted to be aligned with the contact holes in the vacuum plate; and
a pressure means for creating physical contact between the bottom surface of the test plate and the top surface of the electrical contact whenever a vacuum source is connected to the vacuum channel during sliding motion between the test plate and the vacuum plate such that the physical contact and the sliding motion cooperate to clean the top surface of the electrical contact.

31. The electrical component handler of claim 30 in which the contour is a ridge or denticular rail aligned with the component seats and the pressure means is a roller to provide the pressure.

32. The electrical component handler of claim 30 in which the bottom surface has a general plane, and the contour extends beyond the general plane of the bottom surface.

33. An electrical component handler, comprising:
a vacuum plate having an upper surface in a plane, vacuum channels formed in the vacuum plate along spaced-apart annular columns, each vacuum channel having a width, and contact holes positioned between the spaced-apart annular columns and formed through the vacuum plate, the contact holes being adapted to receive respective electrical contacts such that top surfaces of the electrical contacts can be generally in the plane of the upper surface of the vacuum plate;
a test plate having a bottom surface supported by the upper surface of the vacuum plate such that the bottom surface of the test plate is adapted to slide across the upper surface of the vacuum plate, the test plate having component seats for holding electrical components having a component dimension smaller than a surface dimension of the component seats such that at least portions of the electrical components fit within the component seats, and the test plate having vacuum ports that provide vacuum connection between the component seats and the vacuum channels, and alignment of the component seats on the test plate with respect to the contact holes being adapted to bring electrical components in the components seats into contact with the electrical contacts;
a recess in the upper surface of the vacuum plate in vicinity to a contact hole, the recess having an average width that is greater than the width of the vacuum channel; and
pressure means for creating physical contact between the bottom surface of the test plate and the top surface of the electrical contact whenever a vacuum source is connected to the vacuum channel during sliding motion between the test plate and vacuum plate such that the physical contact and the sliding motion cooperate to clean the top surface of the electrical contact.

* * * * *